(12) United States Patent
Scorrano et al.

(10) Patent No.: US 9,780,770 B2
(45) Date of Patent: Oct. 3, 2017

(54) CONTROL UNIT FOR A BRIDGE CIRCUIT, AND RELATED METHOD AND INTEGRATED CIRCUIT

(71) Applicant: STMICROELECTRONICS S.R.L., Agrate Brianza (IT)

(72) Inventors: Matteo Scorrano, Bareggio (IT); Giuseppe Maiocchi, Capiago Intimiano (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 15/163,895

(22) Filed: May 25, 2016

(65) Prior Publication Data

US 2017/0063364 A1 Mar. 2, 2017

(30) Foreign Application Priority Data

Aug. 27, 2015 (IT) .......................... 102015000046790

(51) Int. Cl.
*H03K 17/00* (2006.01)
*H03K 7/08* (2006.01)
*H03K 17/66* (2006.01)
*H02M 7/5387* (2007.01)
*H02P 7/03* (2016.01)

(52) U.S. Cl.
CPC ............. *H03K 7/08* (2013.01); *H03K 17/661* (2013.01); *H02M 7/53871* (2013.01); *H02P 7/04* (2016.02)

(58) Field of Classification Search
USPC ........................................................ 327/365
See application file for complete search history.

(56) References Cited

U.S. PATENT DOCUMENTS

| 5,631,817 A * | 5/1997 | Minami ............ G11B 7/08505 363/41 |
| 5,917,720 A | 6/1999 | Galbiati |
| 6,310,912 B1 * | 10/2001 | Maiocchi .......... H02M 7/53873 375/238 |
| 6,594,308 B1 | 7/2003 | Galbiati et al. |
| 7,176,948 B2 * | 2/2007 | Lewis ................. G09G 3/3406 345/102 |

FOREIGN PATENT DOCUMENTS

| EP | 0760552 A1 | 3/1997 |
| EP | 0892500 A1 | 1/1999 |
| EP | 1653618 A2 | 5/2006 |

* cited by examiner

*Primary Examiner* — Lincoln Donovan
*Assistant Examiner* — Patrick Chen
(74) *Attorney, Agent, or Firm* — Slater Matsil, LLP

(57) ABSTRACT

A control unit is for a bridge circuit. The control unit may include a signal generator configured to generate first and second periodic drive signals for the bridge circuit, and determine a switch-on duration of the first and second periodic drive signals based upon a first digital data value having a first resolution. The control unit may include a controller configured to receive a second digital data value having a second resolution. The second resolution may be greater than the first resolution. The controller may be configured to generate the first digital data value so that, over periods of the first and second periodic drive signals, the first digital data value corresponds to an average of the second digital data value.

20 Claims, 12 Drawing Sheets

| CC | HC | TB | CC1 | HC1 | CC2 | HC2 | OUTA1 | OUTB1 | OUTA2 | OUTB2 | COMP |
|---|---|---|---|---|---|---|---|---|---|---|---|
| 00 | 0 | 0 | 00 | 0 | 00 | 0 | 0 | 0 | 0 | 0 | 0,00 |
| 00 | 0 | 1 | 00 | 1 | 00 | 0 | 0,5 | 0 | 0 | 0 | 0,25 |
| 00 | 1 | 0 | 00 | 1 | 00 | 1 | 0,5 | 0 | 0,5 | 0 | 0,50 |
| 00 | 1 | 1 | 01 | 0 | 00 | 1 | 1 | 0 | 0,5 | 0 | 0,75 |
| 01 | 0 | 0 | 01 | 0 | 01 | 0 | 1 | 0 | 1 | 0 | 1,00 |
| 01 | 0 | 1 | 01 | 1 | 01 | 0 | 1 | 0,5 | 1 | 0 | 1,25 |
| 01 | 1 | 0 | 01 | 1 | 01 | 1 | 1 | 0,5 | 1 | 0,5 | 1,50 |
| 01 | 1 | 1 | 10 | 0 | 01 | 1 | 1 | 1 | 1 | 0,5 | 1,75 |
| 10 | 0 | 0 | 10 | 0 | 10 | 0 | 1 | 1 | 1 | 1 | 2,00 |
| 10 | 0 | 1 | 10 | 1 | 10 | 0 | 1,5 | 1 | 1 | 1 | 2,25 |
| 10 | 1 | 0 | 10 | 1 | 10 | 1 | 1,5 | 1 | 1,5 | 1 | 2,50 |
| 10 | 1 | 1 | 11 | 0 | 10 | 1 | 1,5 | 1,5 | 1,5 | 1 | 2,75 |
| 11 | 0 | 0 | 11 | 0 | 11 | 0 | 1,5 | 1,5 | 1,5 | 1,5 | 3,00 |
| 11 | 0 | 1 | 11 | 1 | 11 | 0 | 2 | 1,5 | 1,5 | 1,5 | 3,25 |
| 11 | 1 | 0 | 11 | 1 | 11 | 1 | 2 | 1,5 | 2 | 1,5 | 3,50 |
| 11 | 1 | 1 | 100 | 0 | 11 | 1 | 2 | 2 | 2 | 1,5 | 3,75 |

Fig. 13a

| CC | HC | TB | CC1 | HC1 | CC2 | HC2 | OUTA1 | OUTB1 | OUTA2 | OUTB2 | COMP |
|---|---|---|---|---|---|---|---|---|---|---|---|
| 00 | 0 | 0 | 00 | 0 | 00 | 0 | 0 | 0 | 0 | 0 | 0,00 |
| 00 | 0 | 1 | 00 | 1 | 00 | 0 | 0,5 | 0 | 0 | 0 | 0,25 |
| 00 | 1 | 0 | 01 | 0 | 00 | 0 | 0,5 | 0,5 | 0 | 0 | 0,50 |
| 00 | 1 | 1 | 01 | 0 | 00 | 1 | 0,5 | 0,5 | 0,5 | 0 | 0,75 |
| 01 | 0 | 0 | 01 | 0 | 01 | 0 | 0,5 | 0,5 | 0,5 | 0,5 | 1,00 |
| 01 | 0 | 1 | 01 | 1 | 01 | 0 | 1 | 0,5 | 0,5 | 0,5 | 1,25 |
| 01 | 1 | 0 | 10 | 0 | 01 | 0 | 1 | 1 | 0,5 | 0,5 | 1,50 |
| 01 | 1 | 1 | 10 | 0 | 01 | 1 | 1 | 1 | 1 | 0,5 | 1,75 |
| 10 | 0 | 0 | 10 | 0 | 10 | 0 | 1 | 1 | 1 | 1 | 2,00 |
| 10 | 0 | 1 | 10 | 1 | 10 | 0 | 1,5 | 1 | 1 | 1 | 2,25 |
| 10 | 1 | 0 | 11 | 0 | 10 | 0 | 1,5 | 1,5 | 1 | 1 | 2,50 |
| 10 | 1 | 1 | 11 | 0 | 10 | 1 | 1,5 | 1,5 | 1,5 | 1 | 2,75 |
| 11 | 0 | 0 | 11 | 0 | 11 | 0 | 1,5 | 1,5 | 1,5 | 1,5 | 3,00 |
| 11 | 0 | 1 | 11 | 1 | 11 | 0 | 2 | 1,5 | 1,5 | 1,5 | 3,25 |
| 11 | 1 | 0 | 100 | 0 | 11 | 0 | 2 | 2 | 1,5 | 1,5 | 3,50 |
| 11 | 1 | 1 | 100 | 0 | 11 | 1 | 2 | 2 | 2 | 1,5 | 3,75 |

Fig. 13b

CONTROL UNIT FOR A BRIDGE CIRCUIT, AND RELATED METHOD AND INTEGRATED CIRCUIT

RELATED APPLICATION

This application is based upon prior filed copending Italian Application No. 102015000046790 filed Aug. 27, 2015, the entire subject matter of which is incorporated herein by reference in its entirety.

TECHNICAL FIELD

The present disclosure relates to a control circuit for driving a load, and more particularly, to a control circuit for driving a load with a bridge and related methods.

BACKGROUND

Driving of loads by way of an output stage comprising of a bridge circuit is well known in the art. For example, such circuits are used to drive electric loads, such as direct current spindle motors and direct current voice coil motors. Such bridge circuits may be useful when also the direction of the current supplied to the load has to be controlled. For example, a complete collection of articles on this subject can be found in the catalog of SGS-THOMSON MICROELECTRONICS, "*Designers' Guide to Power Products*", June 1992 version, in the chapter entitled "*DC and Brushless Motors*".

FIG. 1 shows a bridge circuit 20. The bridge circuit 20 includes two terminals Vcc and GND for receiving a DC power input. The circuit comprises also two terminals OUT1 and OUT2 for providing a power supply signal to a load LOAD, such as a motor. The circuit comprises two control terminals IN1 and IN2 for control inputs.

In the example illustrated, the bridge circuit 20 is based on a full bridge comprising four electronic switches T1, T2, T3 and T4, such as n-channel metal-oxide-semiconductor (MOS) transistors. Specifically, the switches T1 and T3 form a first half-bridge coupled between the power input terminals Vcc and GND, wherein the intermediate point between the switches T1 and T3 is coupled to the output terminal OUT1. Similarly, the switches T2 and T4 form a second half-bridge coupled between the power input terminals Vcc and GND, wherein the intermediate point between the switches T2 and T4 is coupled to the output terminal OUT2.

The control gates of the switches T1-T4 are driven by means of the signals applied to the control terminals IN1 and IN2, whereby only one of the transistors of each half-bridge may be switched on. For example, in the illustrated embodiment, this is achieved by driving the high side switches T1 and T2 directly with the control signals IN1 and IN2, respectively, while the low side switches T3 and T4 are driven with the inverted version of the control signals IN1 and IN2, respectively. For example, the control terminal of the transistor T3 may be coupled to the terminal IN1 through an inverter P1 and the control terminal of the transistor T4 may be coupled to the terminal IN2 through an inverter P2.

Accordingly, when the voltage at the terminal IN1 is high, the transistor T1 is switched on and the transistor T3 is switched off. Conversely, when the voltage at the terminal IN1 is low, the transistor T1 is switched off and the transistor T3 is switched on. The same operation is performed in a corresponding manner also for the switches T2 and T4 based on the voltage at the control terminal IN2.

By applying appropriately control signals to the terminals IN1 and IN2, the power supply signal provided at the output terminal OUT1 and OUT2 may be a voltage signal having a virtually square wave form with a duty cycle such that the average current flowing through the load LOAD coupled to the output OUT1 and OUT2 assumes a desired value.

For example, FIGS. 2a, 2b and 2c show three examples of the signals provided at the output terminals OUT1 and OUT2 and a respective resulting output voltage $V_{out}$ between the terminals OUT1 and OUT2 and a possible current $i_{out}$ flowing through an inductive load LOAD. Specifically, in FIG. 2a, the signals OUT1 and OUT2 have the same waveform, and accordingly the voltage $V_{out}$ between the terminals OUT1 and OUT2 corresponds always to 0V and no current is flowing through the load. Conversely, in FIG. 2b, the output signal OUT2 has shorter pulses and accordingly positive voltage pulses are applied to the load LOAD when the signal OUT1 is high and the signal OUT2 is low.

Finally, in FIG. 2c, the output signal OUT1 has shorter pulses and accordingly negative voltage pulses are applied to the load LOAD when the signal OUT1 is low and the signal OUT2 is high. For example, U.S. Pat. No. 6,594,308 to Galbiati et al. discloses a possible approach for obtaining the signals IN1 and IN2. In this approach, the control signals IN1 and IN2 are obtained through a Phase Shift Modulation (PSM). In this case, a control unit is used which generates the control signals IN1 and IN2 as a function of a digital data value VAL.

For example, as shown in FIG. 3, a digital up-and-down or "bidirection" counter may be used. This counter periodically increments a count value CNT from a minimum value Min until a maximum value Max is reached and then decrements the count value CNT again until the minimum value Min is reached. For example, in case an 8 bit counter is used, the value Min may be 0 (i.e. "0x00") and the value Max may be 255 (i.e. "0xFF"). Accordingly, the count value CNT oscillates around an average count value Avg, with:

$$Avg=(Max-Min)/2.$$

For example, for an 8 bit counter, the average value Avg may be 127.5.

The count value CNT may be compared with the digital value VAL in order to generate the signal IN2. Specifically, in the example illustrated, the signal IN2 is set to high when the counter value CNT is equal or greater than a first threshold value, which corresponds to the value VAL. Accordingly, in case the value VAL corresponds to 128 ("0x80"), a PWM signal with 50% duty cycle is generated.

The signal IN1 has a symmetric behavior with respect to the value Avg. Specifically, in the example illustrated, the signal IN1 is set to high when the counter value CNT is equal or greater than a second threshold value *VAL, which corresponds to:

$$*VAL=Avg-(VAL-Avg)+1=(Max-Min)-VAL+1.$$

Accordingly, also in this case, a PWM signal with 50% duty cycle is generated for the signal IN1 when the value VAL corresponds to 128, because *VAL=128. For example, in FIG. 3, the exemplary waveform for the signals IN1/OUT1 and IN2/OUT2 for the signal VAL set to 145, i.e. the signal *VAL is 111. Accordingly, such a digital approach provides a very low cost approach for generating the signals IN1 and IN2. However, this approach has some significant disadvantages.

First of all, the frequency $f_{PSM}$ of the signals IN1 and IN2 depends on the clock frequency $f_{clk}$ and the number of bits C used by the counter. For example, for an 8 bit counter and a 48 MHZ clock signal, the frequency $f_{PSM}$ would be:

$$f_{PSM} = \frac{48 \text{ MHZ}}{2^{8+1}} = 93.75 \text{ kHz}.$$

Accordingly, an increase of the resolution of the counter by 1 bit indeed halves the frequency of the signals IN1 and IN2.

Moreover, a unitary increment of the value VAL, i.e. a unitary decrement of the value *VAL, e.g. from 111 to 110, will increase the turn-on period of the signal IN1/OUT1 by two clock cycles: a first clock cycle B at the raising edge of the signal IN1 and a second clock cycle D at the falling edge of the signal IN1. Moreover, the same applies also to the signal IN2/OUT2. Specifically, a unitary increment of the value VAL, e.g. from 145 to 146 will decrease the turn-on period of the signal IN2 by two clock cycles: a first clock cycle A at the raising edge of the signal IN2 and a second clock cycle C at the falling edge of the signal IN2. Accordingly, a unitary change of the value VAL, indeed, modifies the duration of the pulse in the voltage Vout provided between the terminals OUT1 and OUT2 by four clock cycles.

U.S. Pat. No. 6,594,308 to Galbiati et al. discloses in this context an approach, which permits to improve this resolution by means of three additional bits, while maintain the resolution of the counter. Specifically, these three bits are used to modify the above periods A, B, C and D, at half-clock-cycle resolution (e.g. the value "000" may mean that the periods of the signal IN1 and IN2 remain unchanged and the value "001" may mean that the periods of the signals IN1 and IN2 should be adapted in order to increase the period of the pulse in the voltage Vout by one half-clock-cycles). This variation may be performed, for example, by anticipating the falling edge of the signal IN2 in the period C by a half-clock-cycle.

A similar approach could also be used by merely using two additional bits, which permit to modify the clock cycles A, B, C and D, at clock-cycle resolution. Accordingly, U.S. Pat. No. 6,594,308 to Galbiati et al. provides an approach that may permit virtually increasing the resolution of the digital signal VAL by three bits (e.g. from 8 bit to 11 bit). However, a further resolution increase has still to be obtained by intervening on the resolution of the digital up-and-down counter, with the negative effect on the frequency $f_{PSM}$, which from a practical point of view should remain above 20 kz, i.e. above the audible band.

SUMMARY

Generally speaking, a control unit is for a bridge circuit. The control unit may include a signal generator configured to generate first and second periodic drive signals for the bridge circuit, and determine a switch-on duration of the first and second periodic drive signals based upon a first digital data value having a first resolution. The control unit may include a controller configured to receive a second digital data value having a second resolution. The second resolution may be greater than the first resolution. The controller may be configured to generate the first digital data value so that, over a plurality of periods of the first and second periodic drive signals, the first digital data value corresponds to an average of the second digital data value.

BRIEF DESCRIPTION OF THE DRAWINGS

FIG. 8b is a digital timing diagram for the signal generator of FIG. 8a.

FIGS. 13a-13b are bit values from the device of FIG. 10.

DETAILED DESCRIPTION

Figure 1:
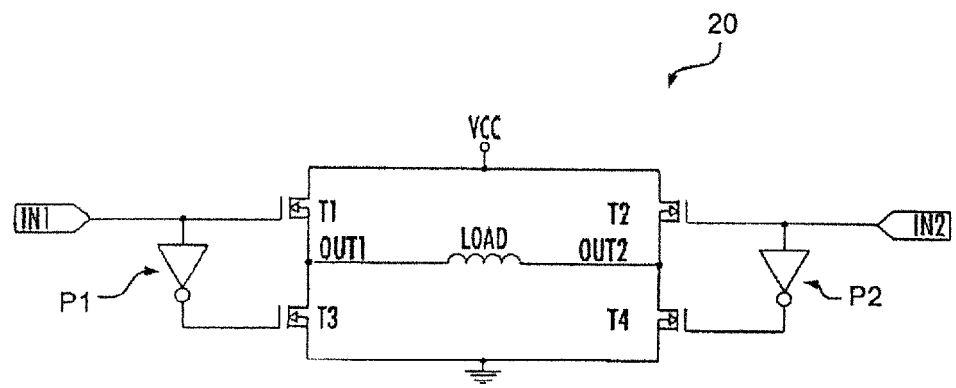
FIG. 1 is a schematic circuit diagram of a bridge circuit, according to the prior art.

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The headings provided herein are for convenience only and do not interpret the scope or meaning of the embodiments.

According to one or more embodiments, one or more of the above problems are solved through a method having the features specifically set forth in the claims that follow. Embodiments moreover concern a related control unit as well as a corresponding related integrated circuit.

In various embodiments, a control unit is used for this purpose, which comprises a signal generator. The signal generator may be configured to generate a first and a second periodic drive signal for the bridge circuit, wherein the signal generator is configured to determine the switch-on duration of the first and/or the second drive signal as a function of a first digital data value having a first resolution.

In various embodiments, the control unit comprises moreover a control circuit configured to generate the first digital data value for the signal generator. Specifically, in various embodiments, this control circuit receives a second digital data value having a second resolution, which is greater than the first resolution, and varies the first digital data value, i.e. the input signal of the signal generator, such that, over a plurality of periods of the first and the second periodic drive signal, the value of the first digital data value corresponds in average to the value of the second digital data value.

For example, the first digital data value may have a first number of bits representing an integer number and the second digital data value may comprise a first group of bits having the same first number of bits and a second group of bits comprising in the remaining bits. In this case, the first group of bits may represent the integer part of the second digital data value and the second group of bits may represent the fractional part of the second digital data value. In various embodiments, the value of the input signal of the signal generator is varied by either setting the first digital data value to the first group of bits or setting the first digital data value to the first group of bits incremented by one.

Generally, the signal generator may have any suitable architecture. For example, in various embodiments, the signal generator may comprise one or two counters and two comparators configured to compare the count value(s) provided by the counter(s) with a first and a second threshold value. In this case, the first and/or the second threshold value may be determined as a function of the first digital data value, i.e. the data signal at the input of the signal generator. For example, in various embodiments, the count values have a given number of bits, and the first and/or the second threshold values are determined as a function of a corresponding number of bits of the first digital data value.

As will be described in the following, the first digital data value may comprise also one or two further bits used to temporarily modify the first and/or the second threshold value. The first digital data value may comprise also one further bit used to modify the switch-on duration of the first or the second drive signal by a half-clock-cycle.

Figure 2A:
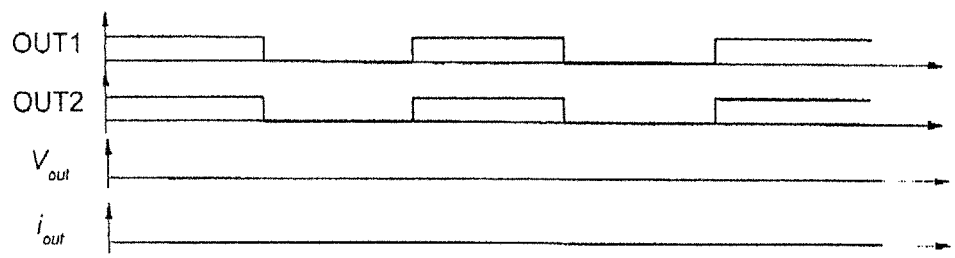
FIGS. 2a-3 are digital timing diagrams for the bridge circuit of FIG. 1.
Figure 2B:
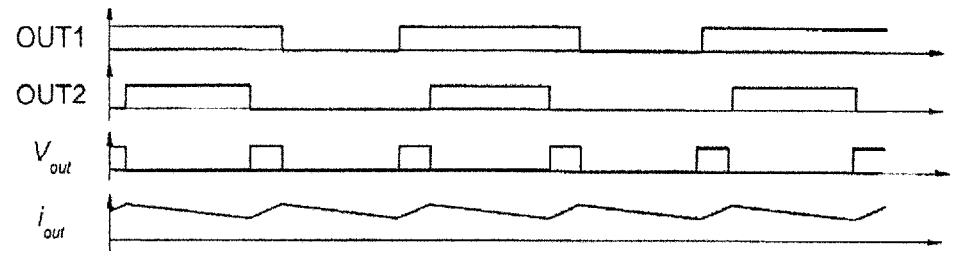
Figure 2C:
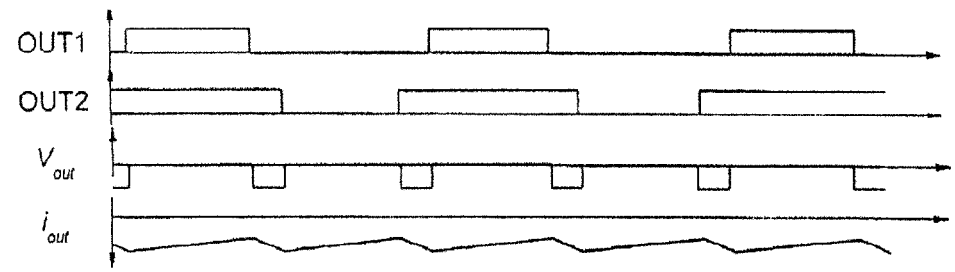
Figure 3:
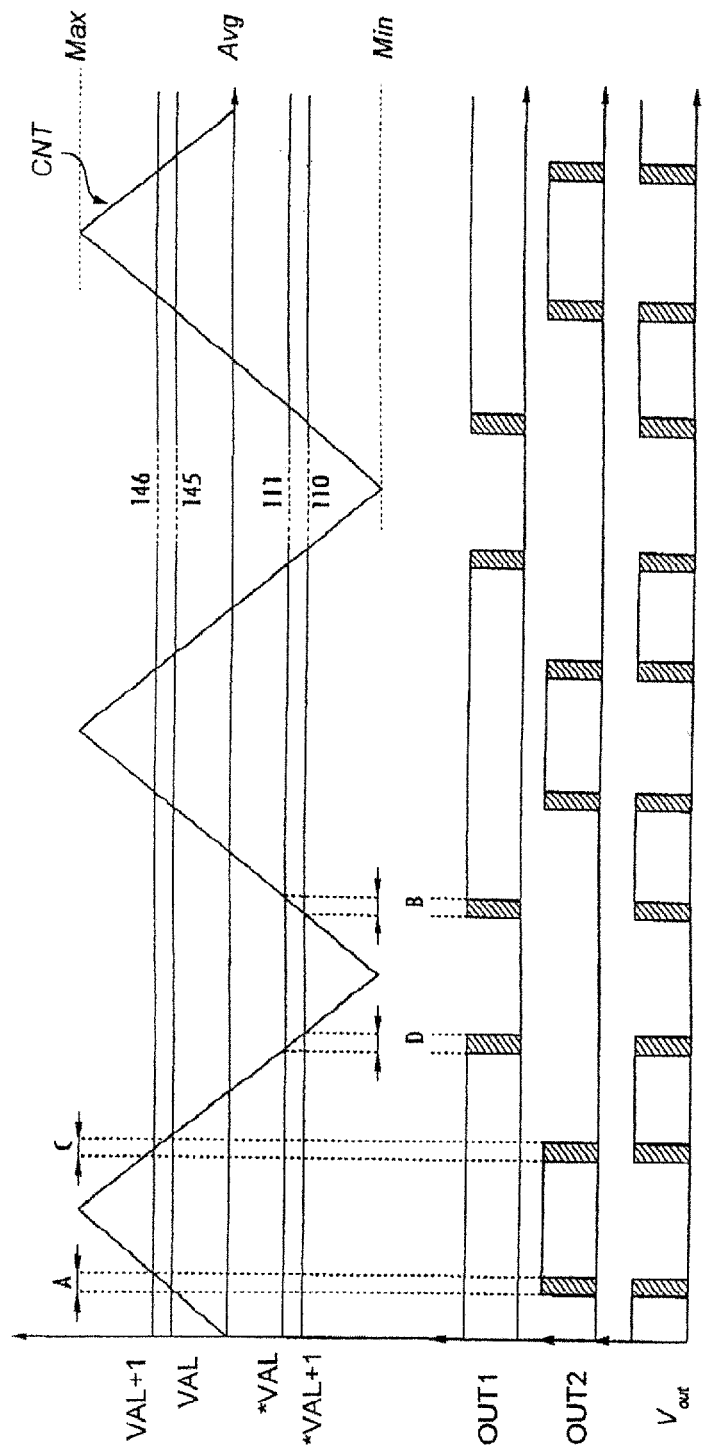

In the following FIGS. 4 to 14, parts, elements or components which have already been described with reference to FIGS. 1 to 3 are denoted by the same references previously used in such Figures; the description of such previously described elements will not be repeated in the following in order not to overburden the present detailed description. As mentioned in the foregoing, the present disclosure provides approaches for generating the drive signals for a bridge circuit.

Figure 4:
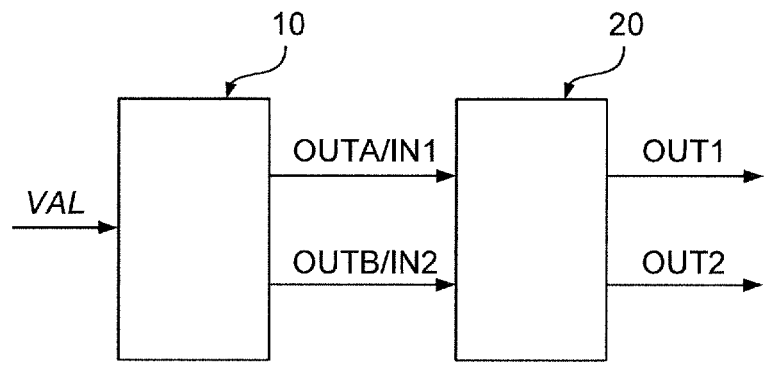
FIG. 4 is a schematic diagram of a device for driving a load, according to the present disclosure.

FIG. 4 shows the general architecture of system adapted to drive a load, such as an electromagnetic R-L actuator, by means of a bridge circuit 20. In the embodiments illustrated, the system comprises a bridge circuit 20 as shown e.g. in FIG. 1, which comprises two inputs IN1 and IN2 for receiving two respective control signals and two outputs OUT1 and OUT2 for connection to a load.

In the illustrated embodiment, the control signals OUTA and OUTB for the inputs IN1 and IN2 are generated by a signal generator 10 as a function of a digital signal VAL. For example, the signal generator 10 and possibly also the bridge circuit 20 may be implemented in an integrated circuit.

Figure 5A:
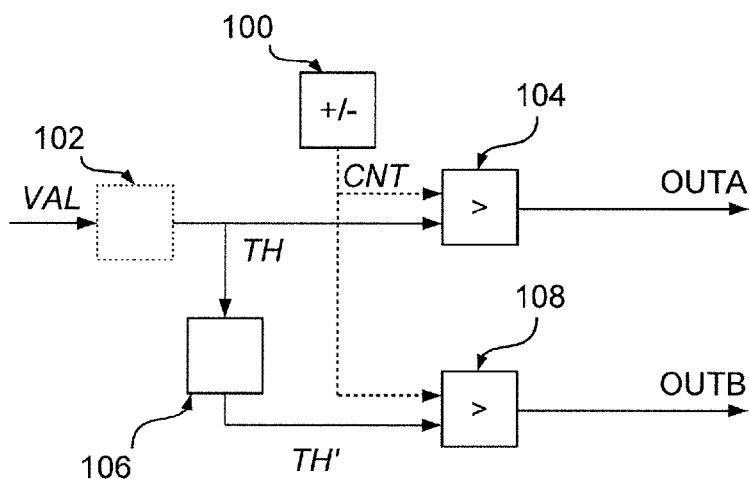
FIGS. 5a-5b, 5e, & 5g are schematic circuit diagrams of embodiments of a signal generator, according to the present disclosure.
Figure 5B:
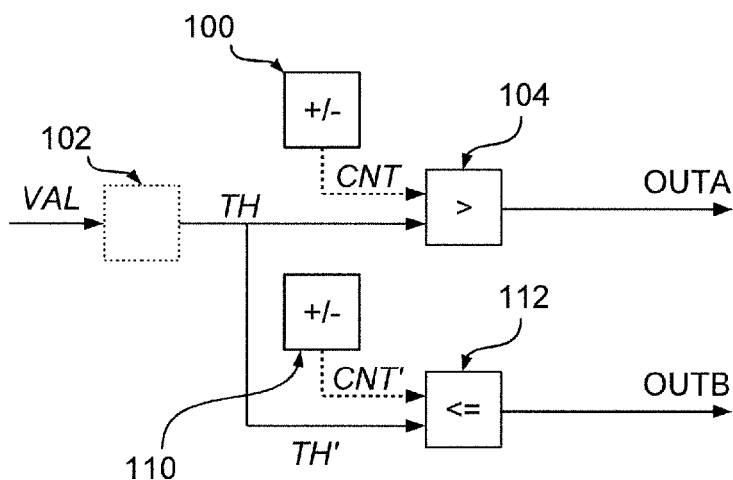
Figure 5C:
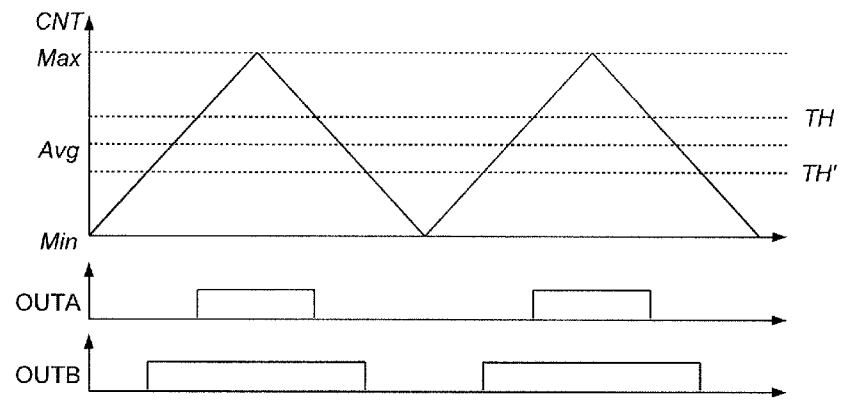
FIGS. 5c-5d, 5f, & 5h are digital timing diagrams for the signal generators of FIGS. 5a-5b, 5e, & 5g.

FIGS. 5a and 5b show two possible embodiments of the signal generator 10. The embodiment shown in FIG. 5a corresponds more or less to the operation described in U.S. Pat. No. 6,594,308 to Galbiati et al. Specifically, in this embodiment, the signal generator 10 comprises a single up-and-down counter 100 and two comparators 104 and 108. Specifically, as shown in FIG. 5c, the counter 100 may periodically increment a count value CNT with a given number of bits C from a minimum value Min to a maximum value Max and then decrements the count value CNT from the maximum value Max to the minimum value Min. For example, an 8 bit counter may count in a range between 0 and 255, i.e. the counter oscillates around an average value Avg:

$$Avg=(Max-Min)/2.$$

The comparators 104 and 108 are configured to determine the output signals OUTA and OUTB by comparing the count value CNT with a first and a second threshold value TH and TH', respectively, e.g. the comparator 104 may determine whether CNT>TH and the comparator 104 may determine whether CNT>TH'.

In the illustrated embodiment, the threshold values TH and TH', which preferably have also C bits, are determined by respective blocks 102 and 106 as a function of the value VAL. For example, in case the value VAL represents only positive numbers, e.g. between 0 and 255 for C=8, the threshold value TH may be directly the value VAL, e.g. the comparator 102 may compare the count value CNT directly with the value VAL, e.g. determines whether CNT>VAL.

Conversely, in case the codification of the value VAL includes also negative numbers, e.g. in a range from −127 to 128 for C=8, the threshold may be set to:

$$TH=(Max-Min-1)/2+VAL.$$

For example, for C=8 the threshold TH may be set to 127+VAL. Accordingly, the block 102 is purely option and the conversion between the value VAL and the threshold TH depends on the codification used for the value VAL.

In the illustrated embodiment, the threshold value TH' is calculated in order to be symmetric with respect to the average value (Max−Min)/2, and may be calculated e.g. as:

$$TH'=(Max-Min-1)-TH.$$

Conversely, in the embodiment shown in FIG. 5b, two up-and-down counters 100 and 110, and two comparators 102 and 112 are used.

Figure 5D:
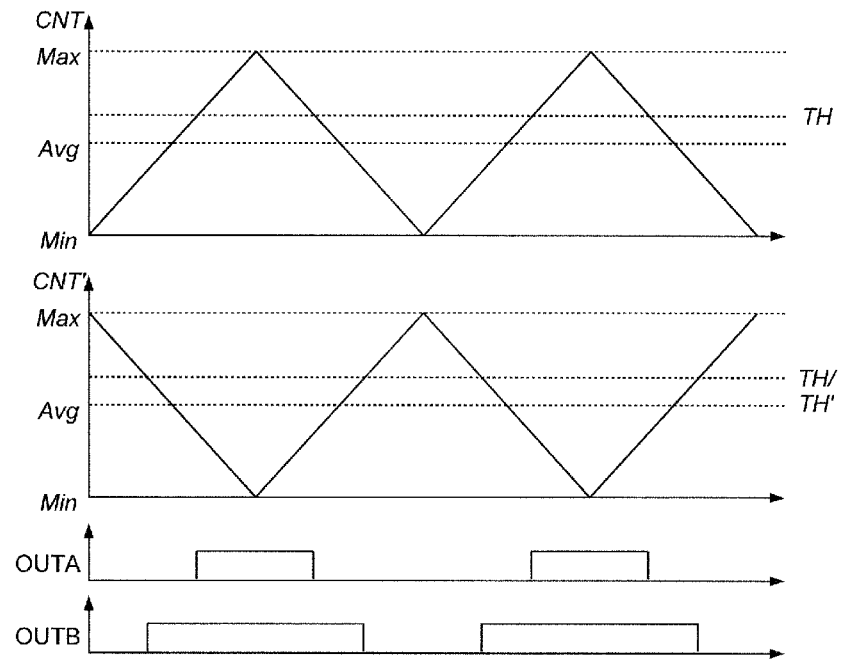

As shown in FIG. 5d, the counter 100, the comparator 104 and possibly the conversion block 102 may operate as in the embodiment described with respect to FIG. 5a, e.g. the comparator 102 (which generates the signal OUTA) may determine whether CNT>TH, wherein the threshold TH is determined as a function of the value VAL.

Conversely, instead of determining a complementary threshold value TH', a second counter 110 is used which has a complementary behavior with respect to the counter 100. Specifically, the counter 110 periodically decrements a count value CNT' with the same number of bits C from the maximum value Max to the minimum value Min and then increments the count value CNT' from the minimum value Min to the maximum value Max. Accordingly, in this case also the behavior of the comparator 112 has to be changed, which e.g. may determine whether CNT'<=TH. Consequently, as described in the foregoing, in this embodiments, a unitary change of the value VAL will increase or decrease the duration of the pulses in the output voltage provided by the bridge circuit 20 by four clock cycles.

Figure 5E:
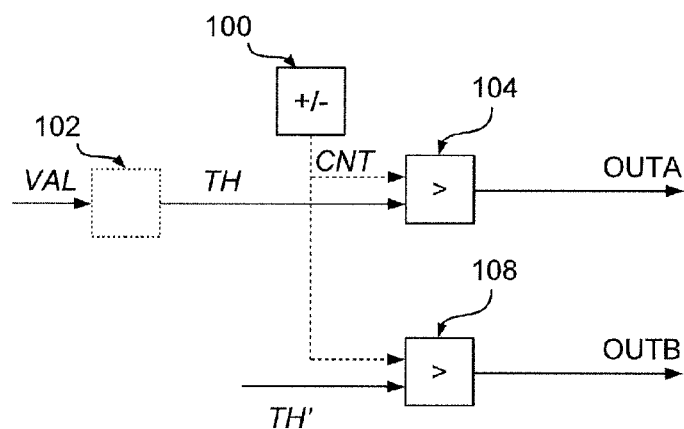
Figure 5F:
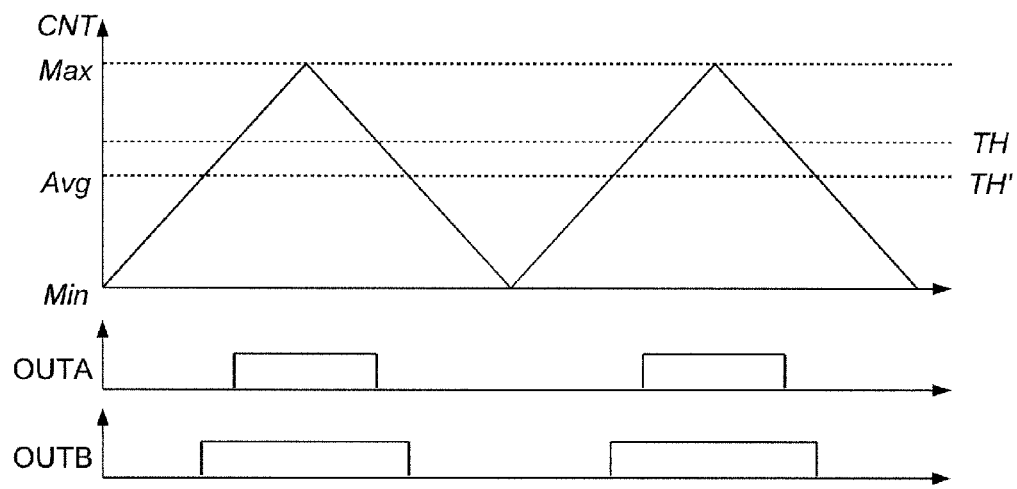
Figure 5G:
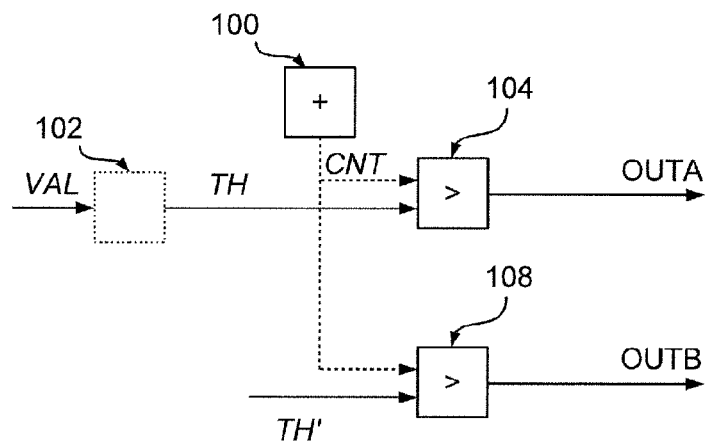

FIGS. 5e and 5g show two further possible embodiments of the signal generator 10. Specifically, in the embodiment shown in FIG. 5e, the signal OUTA is generated as in the previous embodiments. Conversely, the signal OUTB is a PWM signal with a fixed duty cycle, e.g. 50%. For example, the signal OUTS may be obtained by comparing the count value CNT with a fixed threshold TH'.

For example, as shown in FIG. 5f, in order to obtain a duty cycle of 50%, the threshold TH' may be set to the average count value Avg. In this case, the comparator 108 may also be optimized. For example, the comparator 108 may merely select the most significant bit (MSB) of the count value CNT. Accordingly, in this embodiment, a unitary change of the value VAL will increase or decrease the duration of the pulses in the output voltage $V_{out}$ provided by the bridge circuit 20 merely by 2 clock cycles.

Figure 5H:
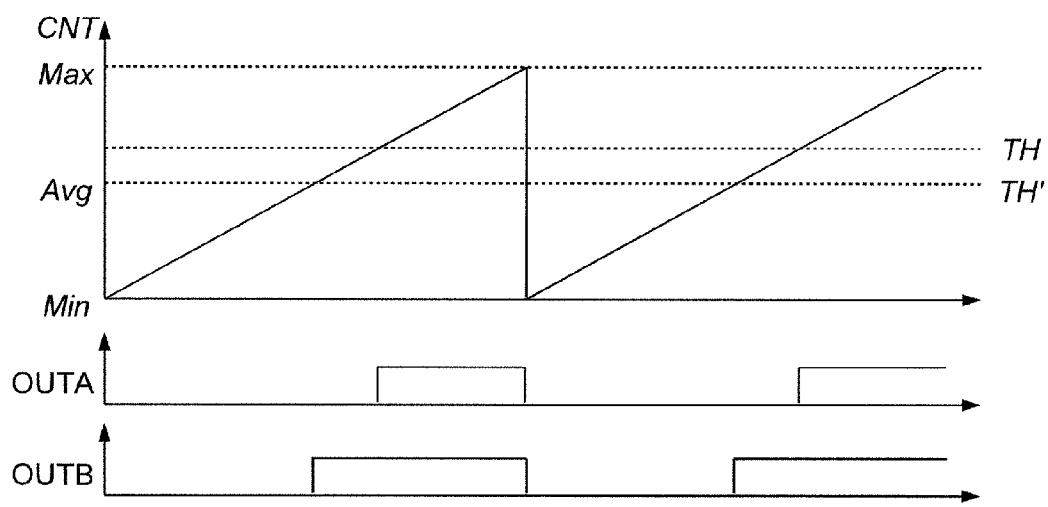

Finally, FIG. 5h shows an embodiment, wherein the up-and-down counter 100 is replaced with a continuous counter 110, i.e. the counter 110 may periodically increment a count value CNT with a given number of bits C from a minimum value Min to a maximum value Max and then reset the count value CNT to the minimum value Min (see also FIG. 5f). Accordingly, in this case, the signal OUTB is switched off when the counter 100 is reset, while the moment of the switch on of the signal OUTB depends on the signal TH/VAL. Conversely, the signal OUTB may be a PWM signal with a fixed duty cycle, e.g. 50%. For example, such a signal OUTS may be obtained as described with respect to the embodiment of FIG. 5e.

Accordingly, in this embodiment, a unitary change of the value VAL will increase or decrease the duration of the pulses in the output voltage $V_{out}$ provided by the bridge circuit 20 merely by one clock cycle. Unfortunately, the embodiments described with respect to FIGS. 5e to 5h have the disadvantage that the duty cycle of the pulses in the output voltage $V_{out}$ may vary only between 0 and 50%, while in the embodiments described with respect to FIGS. 5a to 5d a duty cycle of 100% may be achieved.

Thus, independently of the specific implementation of the signal generator 10, the generator 10 comprises at least one counter with a given number of bits C, which is used to generate two signals OUTA and OUTB. Specifically, during a given period T each of the signals OUTA and OUTB comprises a single pulse, i.e. the signal OUTA is high for a given switch-on duration $T_{onA}$ and low for a given switch-off duration $T_{offA}=T-T_{onA}$. Similarly, the signal OUTS is high for a given switch-on duration $T_{onB}$ and low for a given switch-off duration $T_{offB}=T-T_{onB}$. Moreover, the switch-on duration of at least one of the signals OUTA and OUTB is varied as a function of a signal VAL having a given resolution, i.e. number of bits. For example, the duration T corresponds to $(2 \cdot 2^C)$ clock cycles for the embodiments comprising an up-and-down counter 100 and $(2^C)$ clock cycles for the embodiments comprising a continuous counter 100. Preferably, the value VAL has the same resolution as the counter, i.e. the value VAL has C bit.

Figure 6A:
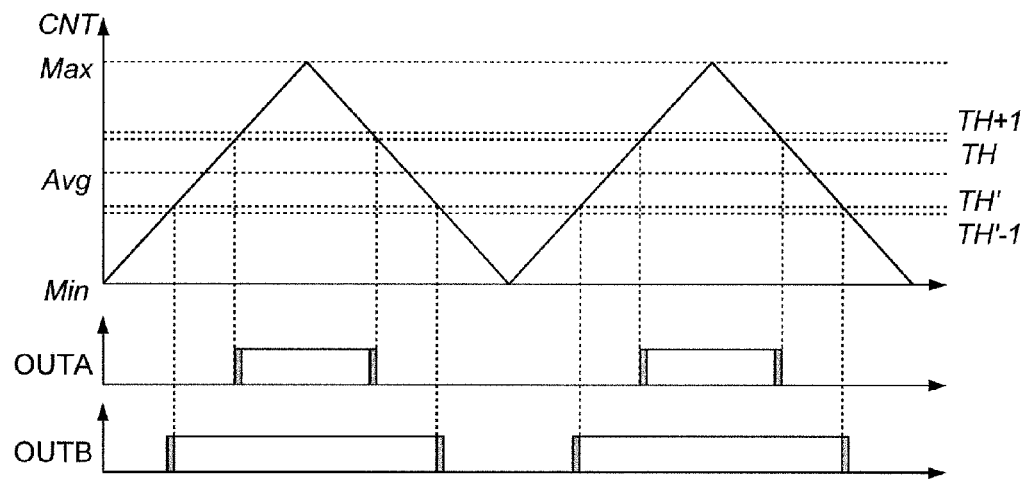
FIGS. 6a-6b are digital timing diagrams for the bridge circuit of FIG. 7.

As disclosed in U.S. Pat. No. 6,594,308 to Galbiati et al., the resolution of the signals generated by the signal generator 10 may also be increased. For example, in the embodiments describe with respect to FIGS. 5a to 5d, two addition bit CC may be used in order to reduce the four clock cycle resolution. Specifically, as shown in FIG. 6a, a unitary increment of the threshold TH will decrease the duration of the signal OUTA by two clock cycles. However, this introduces also a unitary decrement of the threshold TH', which increases the duration of the signal OUTS by two clock cycles.

Accordingly, the two additional bits CC may be used in order to decide, which of the four clock cycles should be "enabled". In fact, the two additional bit CC permit to specify four different values, e.g. the numbers 0 to 3, which may be used to decrease the duration of the signal OUTA and/or increase the duration of the signal OUTB. For example, this may be achieved by modifying the threshold values TH and TH'. For example, the waveform shown in FIG. 6a may correspond to the addition binary bit sequence CC="00", in which the original threshold values TH and TH' are maintained.

Figure 6B:
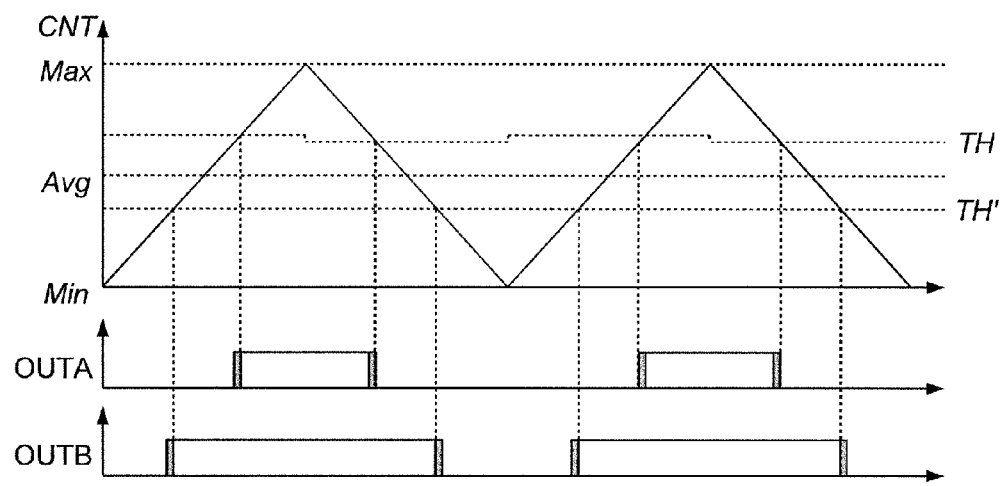

Conversely, FIG. 6b shows an example for the binary bit sequence CC="01", in which the duration of the signal OUTA is decrease by one clock cycle, thereby increasing the duration of the pulse in the output voltage $V_{out}$ by 1 clock cycle. For example, in the illustrated embodiment, this is achieved by incrementing the threshold TH while the counter CNT is increasing.

Figure 7:
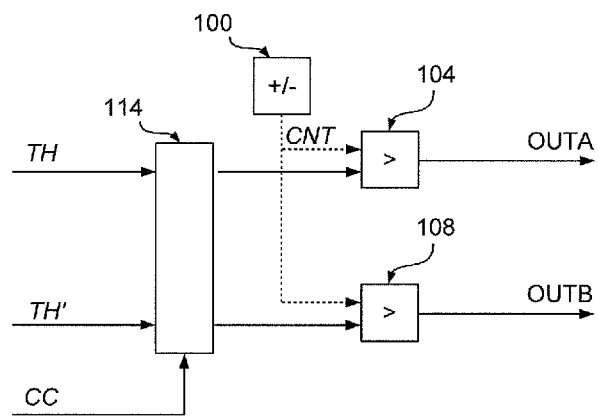
FIG. 7 is a schematic diagram of an embodiment of the signal generator, according to the present disclosure.

Accordingly, as shown in FIG. 7, the signal generator 10 may comprise a block 114, which adapts the thresholds TH and TH' as a function of the signal CC. Generally, the operation of the block 114 may also be synchronized with the counter 100 (and/or the counter 110) in order to determine when the counter is increasing or decreasing.

Those of skill in the art will appreciate that in the embodiment shown with respect to FIGS. 5e and 5f, merely the threshold TH may be changed and accordingly a single bit is sufficient for the signal CC. Conversely, the embodiment shown with respect to FIGS. 5g e 5h already operates at single clock cycle resolution. Finally, a further bit HC may be used in order to permit half-clock-cycle resolution for the signals OUTA and/or OUTB, which thus further doubles the resolution of the signal generator 10.

Figure 8A:
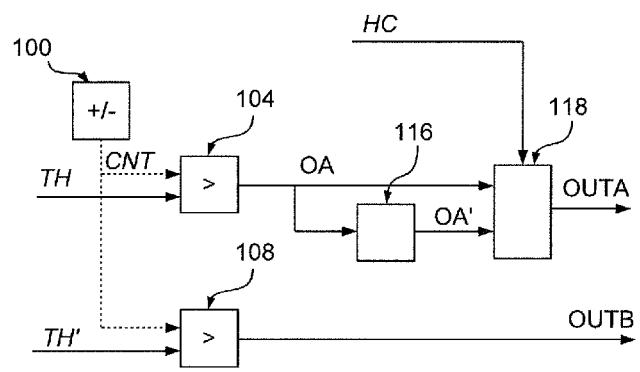
FIG. 8a is a schematic diagram of a signal generator, according to the present disclosure.
Figure 8B:
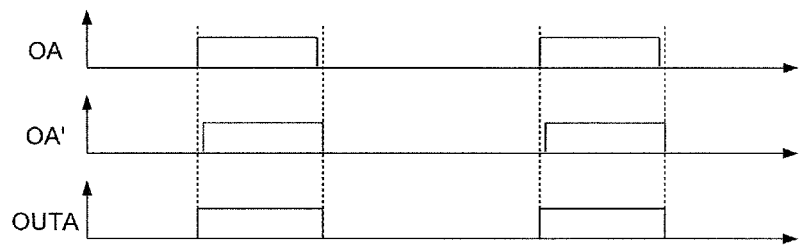

For example, in the embodiment shown in FIG. 8a, the comparator 104 does not provide directly the signal OUTA, but a signal OA, which is set to high e.g. when CNT>TH. The signal OA is then sampled at each falling edge by a block 116, such as a D flip flop. Accordingly, in the illustrated embodiment, the block 116 provides a signal OA' which corresponds to the signal OA delayed by one half-clock cycle.

In the illustrated embodiment, the signals OA and OA' are provided to a block 118 which determines the signal OUTA as a function of the signals OA and OA' and the bit HC. For example, the signals OA and OA' may be combined by a logic OR operation (see FIG. 8b). Accordingly, in this case the resulting signal is high when either the signal OA or the signal OA' is set to high. Accordingly the resulting signal has a duration which is a half-clock cycle longer than the duration of the signal OA. Instead a logic AND operation could be used in order to generate a signal having a duration which is a half-clock cycle shorter than the duration of the signal OA.

Thus, based on the bit HC, a block 118 may select, e.g. by means of a multiplexer, whether the signal OUTA should be the signal OA or the combined signal (OA OR/AND OA'). Those of skill in the art will appreciate that a corresponding circuit may also be used for the signal OUTB.

Accordingly, the signal generator of the present disclosure has the advantage that a change of the signals CC and/or HC may be translated immediately in the output signal, because only the content of the thresholds TH and/or TH' have to be modified at the block 114 or the correct output signal has to be selected by the block 118. Accordingly, these operations may be performed with a latency of a single clock cycle, while in U.S. Pat. No. 6,594,308 to Galbiati et al., 5 flip-flops are used in cascade, thus introducing a significant amount of latency and overhead for the corresponding output multiplexor and the associate decoder.

Figure 9:
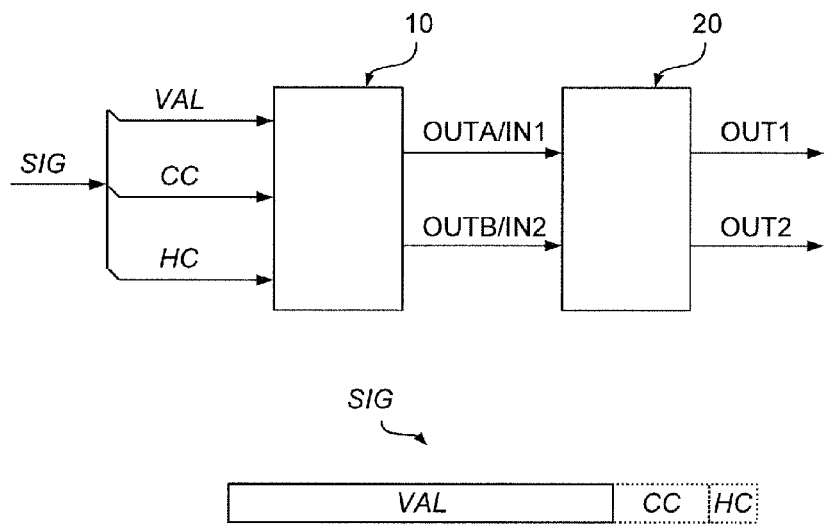
FIG. 9 is a schematic diagram of a signal generator related to FIGS. 6a-8b.

Thus, as shown in FIG. 9, the signal generator 10 may indeed receive at input a binary sequence SIG, which in turn comprises the value VAL, and optionally the values CC and/or HC. For example, in the illustrated embodiment, the most significant bits represent the value VAL and the least significant bit represents the bit HC. For example, assuming an up-and-down counters with C=8 bit, the signal SIG could comprise 11 bit. In various embodiments, the resolution of the output signals OUTA and OUTB may be further increased by means of one or more bits TB.

Figure 10:
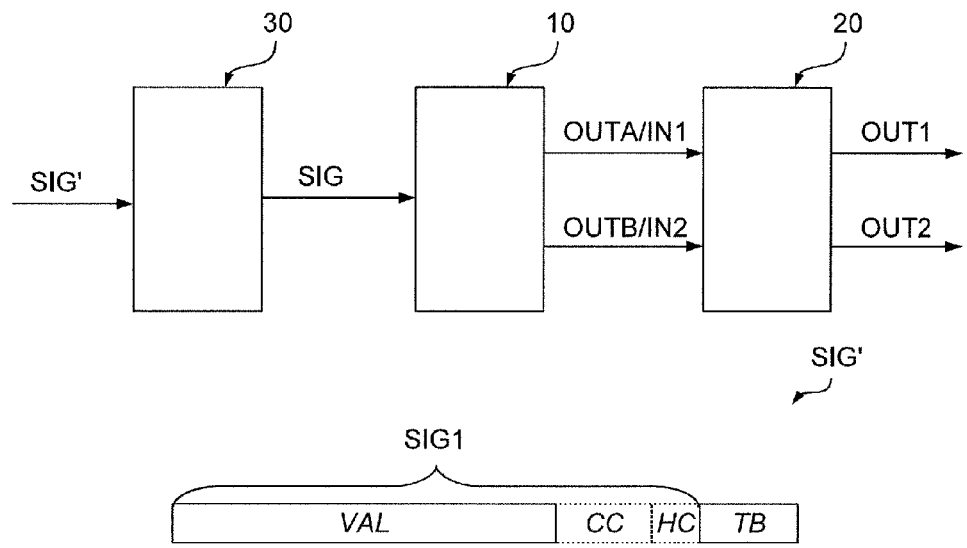
FIG. 10 is a schematic diagram of a device, according to the present disclosure.

For example, FIG. 10 shows an embodiment, in which a control circuit 30 is used for this purpose. Specifically, in the illustrated embodiment, block 30 receives at input a signal SIG' comprising a signal SIG1 having the same number of bits as the signal SIG used as input for the signal generator 10 and a signal TB having additional M bits.

For example, in various embodiments, the bits TB are the least significant bits of the signal SIG'. From a practical point of view the bit sequence SIG1 may be illustrated as an integer number and the bit sequence TB may represent the fractional digits. For example, a single bit may represent (in decimal) either 0.0 when the bit TB is set to "0" or 0.5 when the bit TB is set to "1". For this reason, in various embodiments, the block 30 is configured to vary the value of the signal SIG provided to the signal generator 10, such that in average, the signal SIG corresponds to the value of the higher resolution signal SIG' including the fraction information provided by the bits TB.

Figure 11:
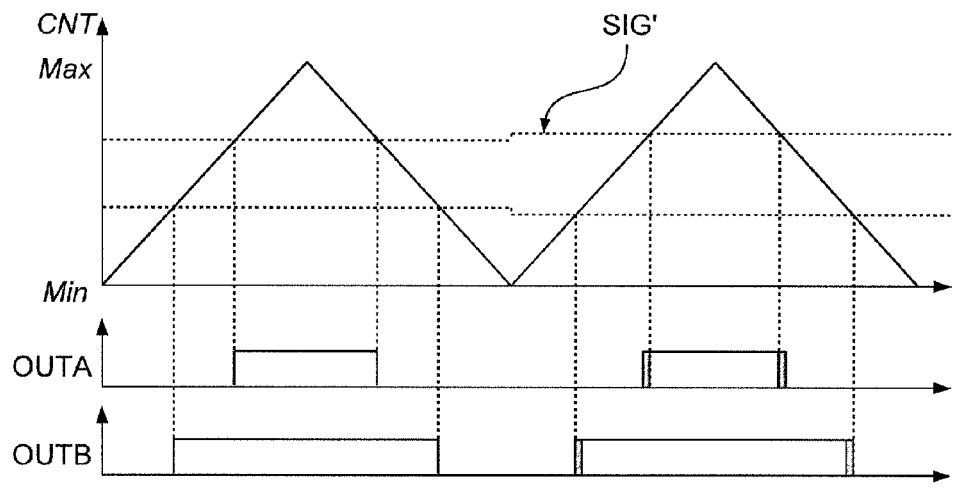
FIG. 11 is a digital timing diagram for the device of FIG. 10.

For example, as shown in FIG. 11, in case the bit TB is set to "1" the block 30 may provide for one period T the original content $SIG_1$=SIG1 to the signal generator 10, and for the next period T a signal corresponding to $SIG_2$=SIG1+1. Accordingly, in average the signal generator 10 would receive (SIG1+(SIG1+1))/2=SIG1+0.5. Evidently the same mechanism may be extended to any number of bits TB. For example, with 2 bits TB may be specified the fractional numbers (in decimal) 0.00 (for TB="00"), 0.25 (for TB="01"), 0.50 (for TB="10") and 0.75 (for TB="11").

In various embodiments, the number of periods T required for performing the averaging operation in time is fixed and corresponds to $2^M$, e.g. 4 periods for M=2. For example, in this case, the block 30 could be configured to determine how often the original signal SIG1 should be incremented by interpreting the bit sequence TB directly as an integer number, e.g. 0 (for TB="00"), 1 (for TB="01"), 2 (for TB="10") and 3 (for TB="11").

Figure 12:
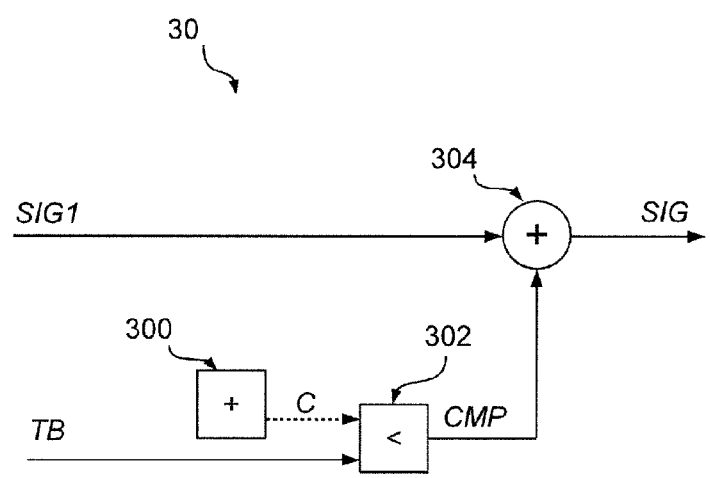
FIG. 12 is a schematic diagram of a component from the device of FIG. 10.

For example, FIG. 12 shows an embodiment of the control circuit 30 comprising a continuous counter 300 having M bits, a comparator 302 and an adder 304. Specifically, the counter 300 count value C is incremented once for each period T and counts from 0 to $2^M-1$, e.g. from 0 to 3 for M=2. Next the comparator 302 compares the count value C with the bit sequence TB in order to determine whether the count value C is smaller than TB, i.e. C<TB. Accordingly, the output CMP of the comparator is set to "1" when the counter is smaller than TB. For example, in case TB="00", the output CMP of the comparator is always low, while the output CMP is high for three clock cycles and low for one clock cycle for TB="11".

Finally, in the illustrated embodiment, the output CMP of the comparator, i.e. 0 or 1, is added to the signal SIG1 at the adder 304, i.e. SIG=SIG1+CMP. For example, FIGS. 13a and 13b shows possible embodiments of the compensation strategy for a system using the bits CC, HC and TB in order to reduce the four clock cycle resolution. Accordingly, the resolution obtainable with these embodiments is $4/2^4$=0.25 clock cycles.

Specifically, the embodiment shown in FIG. 13a follows the previously described rule, i.e. the value of the bit sequence $CC_1$ & $HC_1$ in the first period $T_1$ is incremented when the bit TB is set to 1. Conversely, the bit sequence $CC_2$ & $HC_2$ in the second period $T_2$ corresponds always to the original values of CC and HC. Conversely, FIG. 13b shows that the averaging mechanism over several periods T may also be used when the bit TB is set to "0". For example, the bit sequence CC & HC & TB="0010" may be translated in the sequences $CC_1$ & $HC_1$="010" and $CC_2$ & $HC_2$="000", which still provides in average a compensation COMP of 0.5 clock cycles.

Similarly, the compensation value COMP=1.50 may be obtained by the sequences $CC_1$ & $HC_1$="011" and $CC_2$ & $HC_2$="011" (FIG. 13a), or the sequences $CC_1$ & $HC_1$="100" and $CC_2$ & $HC_2$="010" (FIG. 13b). In fact, generally, it is sufficient that the values correspond in average to the desired compensation value COMP. For example, the compensation may also imply that the value VAL has to be increased. For example, this is shown by the bit sequence "100" for the signal CC1 which indicates that the overflow bit "1" has to be added to the value VAL.

FIGS. 13a and 13b show also different strategies, which may be implemented in the signal generator 10. For example, the sequence $CC_1$ & $HC_1$="010", which identifies a compensation of 1 clock cycle, may be implemented by a compensation of the period of $T_{onA}$ by 1 clock cycle and no compensation of the period of $T_{onB}$ (FIG. 13a), or a compensation of the period of $T_{onA}$ by 0.5 clock cycle and a compensation of the period of $T_{onB}$ by 0.5 clock (FIG. 13b).

Figure 14:
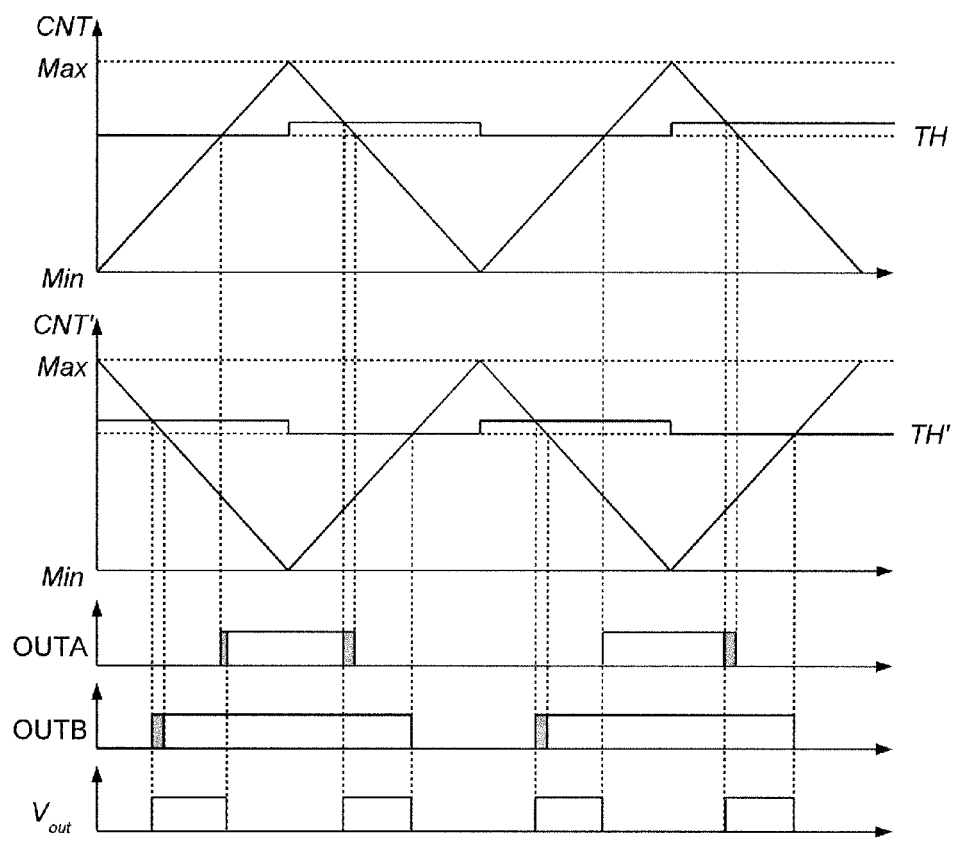
FIG. 14 is another digital timing diagram for the device of FIG. 10.

For example, FIG. 14 shows an embodiment of the waveforms generated by the complete system for the bit sequence CC & HC & TB=1001", which corresponds to an average compensation of 2.25 clock cycles. For example, according to the embodiment shown in FIG. 13b, the block 30 could be configured for compensating 2.5 clock cycles in the first period and 2.0 clock cycles in the second period. For example, this may be obtained by: in the first period $T_1$, reducing the pulse duration $T_{onA}$ of the signal $OUTA_1$ by 1.5 clock cycles, and increasing the pulse duration $T_{onB}$ of the signal $OUTB_1$ by 1.0 clock cycles; and in the second period $T_2$, reducing the pulse duration $T_{onA}$ of the signal $OUTA_2$ by 1.0 clock cycles, and increasing the pulse duration $T_{onB}$ of the signal $OUTB_2$ by 1.0 clock cycle.

Of course, without prejudice to the principle of present disclosure, the details of construction and the embodiments may vary widely with respect to what has been described and illustrated herein purely by way of example, without thereby departing from the scope of the present disclosure, as defined by the ensuing claims.

That which is claimed is:

1. A control unit for a bridge circuit, the control unit comprising:

a signal generator configured to generate first and second periodic drive signals for the bridge circuit, and determine a switch-on duration of the first and second periodic drive signals based upon a first digital data value having a first resolution; and a controller configured to receive a second digital data value having a second resolution, the second resolution being greater than the first resolution, and generate the first digital data value so that, over a plurality of periods of the first and second periodic drive signals, the first digital data value corresponding to an average of the second digital data value;

wherein the signal generator comprises a first counter configured to generate a first count value having a fourth number of bits, and a first comparator configured to generate the first periodic drive signal by comparing the first count value with a first threshold value, the first threshold value being based upon the first digital data value; and wherein the signal generator comprises a second comparator configured to generate the second periodic drive signal by comparing the first count value with a second threshold value, the second threshold value being based upon the first digital data value.

2. The control unit according to claim 1, wherein the first digital data value has a first number of bits representing an integer number;
wherein the second digital data value comprises a first group of bits having a second number of bits equal to the first number of bits and a second group of bits comprising a third number of bits equal to remaining bits in the second digital data value; and
wherein the first group of bits represents an integer part of the second digital data value and the second group of bits represents a fractional part of the second digital data value.

3. The control unit according to claim 2, wherein the controller is configured to set the first digital data value to at least one of the first group of bits and the first group of bits incremented by one.

4. The control unit according to claim 1, wherein the first digital data value has at least the fourth number of bits and wherein the first threshold value is based upon the first digital data value.

5. A control unit for a bridge circuit, the control unit comprising:
a signal generator configured to generate first and second periodic drive signals for the bridge circuit, and determine a switch-on duration of the first and second periodic drive signals based upon a first digital data value having a first resolution; and
a controller configured to receive a second digital data value having a second resolution, the second resolution being greater than the first resolution, and generate the first digital data value so that, over a plurality of periods of the first and second periodic drive signals, the first digital data value corresponding to an average of the second digital data value;
wherein the signal generator comprises:
a first counter configured to generate a first count value having a fourth number of bits, and
a first comparator configured to generate the first periodic drive signal by comparing the first count value with a first threshold value, the first threshold value being based upon the first digital data value,
a second counter configured to generate a second count value having the fourth number of bits, and
a second comparator configured to generate the second periodic drive signal by comparing the second count value with a second threshold value, the second threshold value being based upon the first digital data value, wherein the first digital data value comprises additional bits; and wherein the signal generator is configured to modify the first and the second threshold values based upon the additional bits.

6. The control unit according to claim 5, wherein the first digital data value has a first number of bits representing an integer number;
wherein the second digital data value comprises a first group of bits having a second number of bits equal to the first number of bits and a second group of bits comprising a third number of bits equal to remaining bits in the second digital data value; and
wherein the first group of bits represents an integer part of the second digital data value and the second group of bits represents a fractional part of the second digital data value.

7. The control unit according to claim 6, wherein the controller is configured to set the first digital data value to at least one of the first group of bits and the first group of bits incremented by one.

8. The control unit according to claim 5, wherein the first digital data value has at least the fourth number of bits; and wherein the first threshold value is based upon the first digital data value.

9. A control unit for a bridge circuit, the control unit comprising:
a signal generator configured to generate first and second periodic drive signals for the bridge circuit, and determine a switch-on duration of the first and second periodic drive signals based upon a first digital data value having a first resolution; and
a controller configured to receive a second digital data value having a second resolution, the second resolution being greater than the first resolution, and generate the first digital data value so that, over a plurality of periods of the first and second periodic drive signals, the first digital data value corresponding to an average of the second digital data value;
wherein the signal generator comprises a first counter configured to generate a first count value having a fourth number of bits, and a first comparator configured to generate the first periodic drive signal by comparing the first count value with a first threshold value, the first threshold value being based upon the first digital data value;
wherein the first digital data value comprises an additional bit; and
wherein the signal generator is configured to modify the switch-on duration of the first and second periodic drive signals by a half-clock-cycle based upon the additional bit.

10. The control unit according to claim 9, wherein the first digital data value has a first number of bits representing an integer number;
wherein the second digital data value comprises a first group of bits having a second number of bits equal to the first number of bits and a second group of bits comprising a third number of bits equal to remaining bits in the second digital data value; and
wherein the first group of bits represents an integer part of the second digital data value and the second group of bits represents a fractional part of the second digital data value.

11. The control unit according to claim 10, wherein the controller is configured to set the first digital data value to at least one of the first group of bits and the first group of bits incremented by one.

12. The control unit according to claim 9, wherein the first digital data value has at least the fourth number of bits and wherein the first threshold value is based upon the first digital data value.

13. An electronic device comprising:
a bridge circuit; and
a control unit for the bridge circuit, the control unit comprising:
a signal generator configured to generate first and second periodic drive signals for the bridge circuit, and determine a switch-on duration of the first and second periodic drive signals based upon a first digital data value having a first resolution; and
a controller configured to receive a second digital data value having a second resolution, the second resolution being greater than the first resolution, and generate the first digital data value so that, over a plurality of periods of the first and second periodic drive signals, the first digital data value corresponding to an average of the second digital data value;

wherein the signal generator comprises:
- a first counter configured to generate a first count value having a fourth number of bits;
- a first comparator configured to generate the first periodic drive signal by comparing the first count value with a first threshold value, the first threshold value being based upon the first digital data value; and
- a second comparator configured to generate the second periodic drive signal by comparing the first count value with a second threshold value, the second threshold value being based upon the first digital data value.

14. The electronic device according to claim 13, wherein the first digital data value has a first number of bits representing an integer number;

wherein the second digital data value comprises a first group of bits having a second number of bits equal to the first number of bits and a second group of bits comprising a third number of bits equal to remaining bits in the second digital data value; and wherein the first group of bits represents an integer part of the second digital data value and the second group of bits represents a fractional part of the second digital data value.

15. The electronic device according to claim 14, wherein the controller is configured to set the first digital data value to at least one of the first group of bits and the first group of bits incremented by one.

16. The electronic device according to claim 13, wherein the first digital data value has at least the fourth number of bits and wherein the first threshold value is based upon the first digital data value.

17. A method for driving a bridge circuit with a signal generator generating first and second periodic drive signals for the bridge circuit, and determining a switch-on duration of the first and second periodic drive signals based upon a first digital data value having a first resolution, the method comprising:

receiving a second digital data value having a second resolution, the second resolution being greater than the first resolution; and generating the first digital data value so that, over a plurality of periods of the first and second periodic drive signals, the first digital data value corresponding to an average of the second digital data value;

wherein generating first periodic drive signal comprises generating a first count value having a fourth number of bits with a first counter, and comparing the first count value with a first threshold value, the first threshold value being based upon the first digital data value; and wherein generating the second periodic drive signal comprises comparing the first count value with a second threshold value, the second threshold value being based upon the first digital data value.

18. The method according to claim 17, wherein the first digital data value has a first number of bits representing an integer number;

wherein the second digital data value comprises a first group of bits having a second number of bits equal to the first number of bits and a second group of bits comprising a third number of bits equal to remaining bits in the second digital data value; and wherein the first group of bits represents an integer part of the second digital data value and the second group of bits represents a fractional part of the second digital data value.

19. The method according to claim 18, further comprising setting the first digital data value to at least one of the first group of bits and the first group of bits incremented by one.

20. The method according to claim 17, wherein the first digital data value has at least the fourth number of bits.

* * * * *